United States Patent
De Mattia et al.

(10) Patent No.: US 11,180,976 B2
(45) Date of Patent: Nov. 23, 2021

(54) METHOD AND SYSTEM FOR UNCONVENTIONAL GAS LIFT OPTIMIZATION

(71) Applicant: ExxonMobil Upstream Research Company, Spring, TX (US)

(72) Inventors: Marco De Mattia, Houston, TX (US); Mahsa Memarzadeh, Spring, TX (US); Curtis J. Holub, Spring, TX (US); Amr S. El-Bakry, Houston, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 159 days.

(21) Appl. No.: 16/702,827

(22) Filed: Dec. 4, 2019

(65) Prior Publication Data

US 2020/0199977 A1   Jun. 25, 2020

Related U.S. Application Data

(60) Provisional application No. 62/783,737, filed on Dec. 21, 2018.

(51) Int. Cl.

| | |
|---|---|
| *E21B 41/00* | (2006.01) |
| *E21B 43/12* | (2006.01) |
| *E21B 47/008* | (2012.01) |
| *G05B 13/04* | (2006.01) |
| *G06F 30/20* | (2020.01) |

(Continued)

(52) U.S. Cl.
CPC ........ *E21B 41/0092* (2013.01); *E21B 43/123* (2013.01); *E21B 47/008* (2020.05); *G01L 19/04* (2013.01); *G05B 13/041* (2013.01); *G05D 7/00* (2013.01); *G06F 30/20* (2020.01);

(Continued)

(58) Field of Classification Search
None
See application file for complete search history.

(56) References Cited

U.S. PATENT DOCUMENTS

| | | |
|---|---|---|
| 6,182,756 B1 | 2/2001 | Garcia et al. |
| 6,595,294 B1 | 7/2003 | Dalsmo et al. |

(Continued)

FOREIGN PATENT DOCUMENTS

| | | |
|---|---|---|
| EP | 2004953 B1 | 10/2009 |
| WO | WO2009005876 | 1/2009 |
| WO | WO2017223483 | 12/2017 |

*Primary Examiner* — Lina M Cordero
(74) *Attorney, Agent, or Firm* — LeandroArechederra, III

(57) ABSTRACT

A method is provided for determining the frequency of a multi-rate well testing operation in a gas-lifted hydrocarbon well. A well performance characteristic of the well is monitored using single-rate well tests. The monitored well performance characteristic is compared to a current well model performance characteristic. If the monitored well performance characteristic differs from the current well model performance characteristic by less than a predetermined amount, an amount of gas is injected into the well based on the current well model performance characteristic. If the monitored well performance characteristic differs from the current well model performance characteristic by more than a predetermined amount, a multi-rate well test is initiated the results of the multi-rate well test are fitted to a revised well model performance characteristic, and an amount of gas is injected into the well based on the revised well model performance characteristic.

20 Claims, 5 Drawing Sheets

(51) Int. Cl.
    *G01L 19/04*     (2006.01)
    *G05D 7/00*     (2006.01)
    *E21B 47/06*     (2012.01)
    *E21B 47/07*     (2012.01)

(52) U.S. Cl.
    CPC ............ *E21B 43/122* (2013.01); *E21B 47/06* (2013.01); *E21B 47/07* (2020.05); *E21B 2200/20* (2020.05)

(56) References Cited

U.S. PATENT DOCUMENTS

| | | |
|---|---|---|
| 6,840,317 B2 | 1/2005 | Hirsch et al. |
| 7,172,020 B2 | 2/2007 | Tseythlin |
| 7,627,461 B2 | 12/2009 | Guyaguler et al. |
| 7,711,486 B2 | 5/2010 | Thigpen et al. |
| 7,953,584 B2 | 5/2011 | Rashid |
| 7,953,585 B2 | 5/2011 | Gurpinar et al. |
| 8,214,186 B2 | 7/2012 | Cuevas et al. |
| 8,290,632 B2 | 10/2012 | Briers et al. |
| 8,380,642 B2 | 2/2013 | Stundner et al. |
| 8,571,688 B2 | 10/2013 | Coward |
| 8,600,717 B2 | 12/2013 | Rashid et al. |
| 8,670,966 B2 | 3/2014 | Rashid et al. |
| 9,104,823 B2 | 8/2015 | Rashid et al. |
| 9,951,601 B2 | 4/2018 | Rashid et al. |
| 10,138,724 B2 | 11/2018 | Querales et al. |
| 10,331,093 B2 | 6/2019 | Fleming et al. |
| 10,345,764 B2 * | 7/2019 | Early .................... E21B 41/00 |
| 2002/0177955 A1 | 11/2002 | Jalali et al. |
| 2012/0215364 A1 | 8/2012 | Rossi |
| 2014/0039793 A1 * | 2/2014 | Querales ............... E21B 43/122 |
| | | 702/6 |
| 2015/0127314 A1 | 5/2015 | Fleming et al. |
| 2015/0169798 A1 | 6/2015 | Fleming et al. |
| 2016/0053593 A1 * | 2/2016 | Romer .................... F04F 1/08 |
| | | 700/282 |
| 2017/0183955 A1 | 6/2017 | Peacock et al. |
| 2018/0357343 A1 | 12/2018 | Klenner et al. |
| 2019/0353016 A1 * | 11/2019 | Sandidge ............... E21B 47/10 |

\* cited by examiner

METHOD AND SYSTEM FOR UNCONVENTIONAL GAS LIFT OPTIMIZATION

CROSS REFERENCE TO RELATED APPLICATIONS

This application claims the priority benefit of U.S. Provisional Patent Application No. 62/783,737, filed Dec. 21, 2018, entitled METHOD AND SYSTEM FOR UNCONVENTIONAL GAS LIFT OPTIMIZATION.

FIELD

The present disclosure relates generally to drilling for hydrocarbons. More specifically, the present disclosure relates to gas lift optimization for unconventional hydrocarbon assets.

BACKGROUND

Artificial lift is comprised of methods used to transport produced fluids to the surface when reservoir pressure alone is insufficient. Gas lift is a common method that is particularly suited to high-volume offshore wells. A high pressure (up to several thousand psi) gas is injected into the tubing by a casing annulus and travels to a gas lift valve. The operating valve provides a pathway for a designed volume of gas to enter the production tubing. The gas reduces the density of the fluid column, decreasing backpressure on the producing formation. The available reservoir pressure can then force more fluid to the surface. Gas lift valves are effectively pressure regulators and are typically installed during well completion. Multiple gas lift valves may be required to unload completion fluid from the annulus so injected gas can reach the operating valve.

Gas lift is known to be effective, and gas lift wells have generally been proven to be low maintenance. One issue, however, is that gas lift wells remain operational even when they are not optimized. A non-optimized gas lift well will typically still flow production fluids, albeit at a reduced production rate, even if it is receiving too much, or too little, gas lift gas and/or is lifting from multiple valves or a valve above the operating point. Field diagnostics and modeling have estimated that less than 25% of gas lift wells are optimized, resulting in lost production and inefficient allocation of lift gas.

Gas lift performance is typically gauged through periodic well testing. A test separator is commonly used to measure the volume of liquid and gas produced by a well. A typical well test can take four to twelve or more hours. If a change is made to a well, such as increasing or decreasing the gas lift rate or adjusting a production choke, the well may need several hours to stabilize at a new operating condition before it can be re-tested. One method of optimizing a gas lift well is to select a gas lift rate and test the well, and then repeat the process with additional gas lift rates until a gas lift performance relationship is obtained. The most effective/economic gas lift rate can then be selected. Unfortunately, offshore facilities have a limited amount of space for equipment, so a given production platform or vessel may only have one to two test separators for deployment. If each well must be tested at least monthly for regulatory purposes, the test separator may not be available for gas lift optimization.

Other more technical options for gas lift optimization are not always feasible. For instance, gas lift wells can be modeled with inflow and outflow software and producing pressures and temperatures can be compared to the models. However, this strategy requires accurate models and pressure and temperature transducers located in the flow path. Additionally, the software and sensors must be maintained and periodically recalibrated to ensure accuracy, as well performance changes over time. Multi-phase flow meters could be installed for each individual well, but these tools are relatively expensive and new to the industry.

Further challenges arise when trying to provide a practical and scalable method of optimizing the integrated production of gas lifted unconventional wells. For example, asset size, generally described in terms of the number of wells, is often the major limiting factor for optimizing systems with a large number of wells. Relying exclusively on model-based optimization methods is often not realistic due to the impracticality of generating and maintaining large numbers of well models over their life time.

As such, there exists a need to address the aforementioned problems and issues. Therefore, what is needed are simpler solutions for gas lift optimization and systems for their implementation.

SUMMARY

In one aspect, a method is provided for determining the frequency of a multi-rate well testing operation in a gas-lifted hydrocarbon well. A well performance characteristic of the well is monitored using single-rate well tests. The monitored well performance characteristic is compared to a current well model performance characteristic. If the monitored well performance characteristic differs from the current well model performance characteristic by less than a predetermined amount, an amount of gas is injected into the well based on the current well model performance characteristic. If the monitored well performance characteristic differs from the current well model performance characteristic by more than a predetermined amount, a multi-rate well test is initiated the results of the multi-rate well test are fitted to a revised well model performance characteristic, and an amount of gas is injected into the well based on the revised well model performance characteristic.

In another aspect, a computer system is disclosed. The computer system has a memory and a processor in communication with the memory. The processor is programmed to determine a frequency of a multi-rate well testing operation in a gas-lifted hydrocarbon well by: monitoring a well performance characteristic of the well using single-rate well tests; comparing the monitored well performance characteristic to a current well model performance characteristic; if the monitored well performance characteristic differs from the current well model performance characteristic by less than a predetermined amount, generating an instruction to inject an amount of gas into the well based on the current well model performance characteristic; if the monitored well performance characteristic differs from the current well model performance characteristic by more than a predetermined amount, generating an instruction to initiate a multi-rate well test, and fitting results of the multi-rate well test to a revised well model performance characteristic.

DESCRIPTION OF THE DRAWINGS

The present disclosure is susceptible to various modifications and alternative forms, specific exemplary implementations thereof have been shown in the drawings and are herein described in detail. It should be understood, however, that the description herein of specific exemplary implementations is not intended to limit the disclosure to the particular forms disclosed herein. This disclosure is to cover all modifications and equivalents as defined by the appended claims. It should also be understood that the drawings are not necessarily to scale, emphasis instead being placed upon clearly illustrating principles of exemplary embodiments of the present invention. Moreover, certain dimensions may be exaggerated to help visually convey such principles. Further where considered appropriate, reference numerals may be repeated among the drawings to indicate corresponding or analogous elements. Moreover, two or more blocks or elements depicted as distinct or separate in the drawings may be combined into a single functional block or element. Similarly, a single block or element illustrated in the drawings may be implemented as multiple steps or by multiple elements in cooperation. The forms disclosed herein are illustrated by way of example, and not by way of limitation, in the figures of the accompanying drawings and in which like reference numerals refer to similar elements and in which:

DETAILED DESCRIPTION

Terminology

Figure 1:
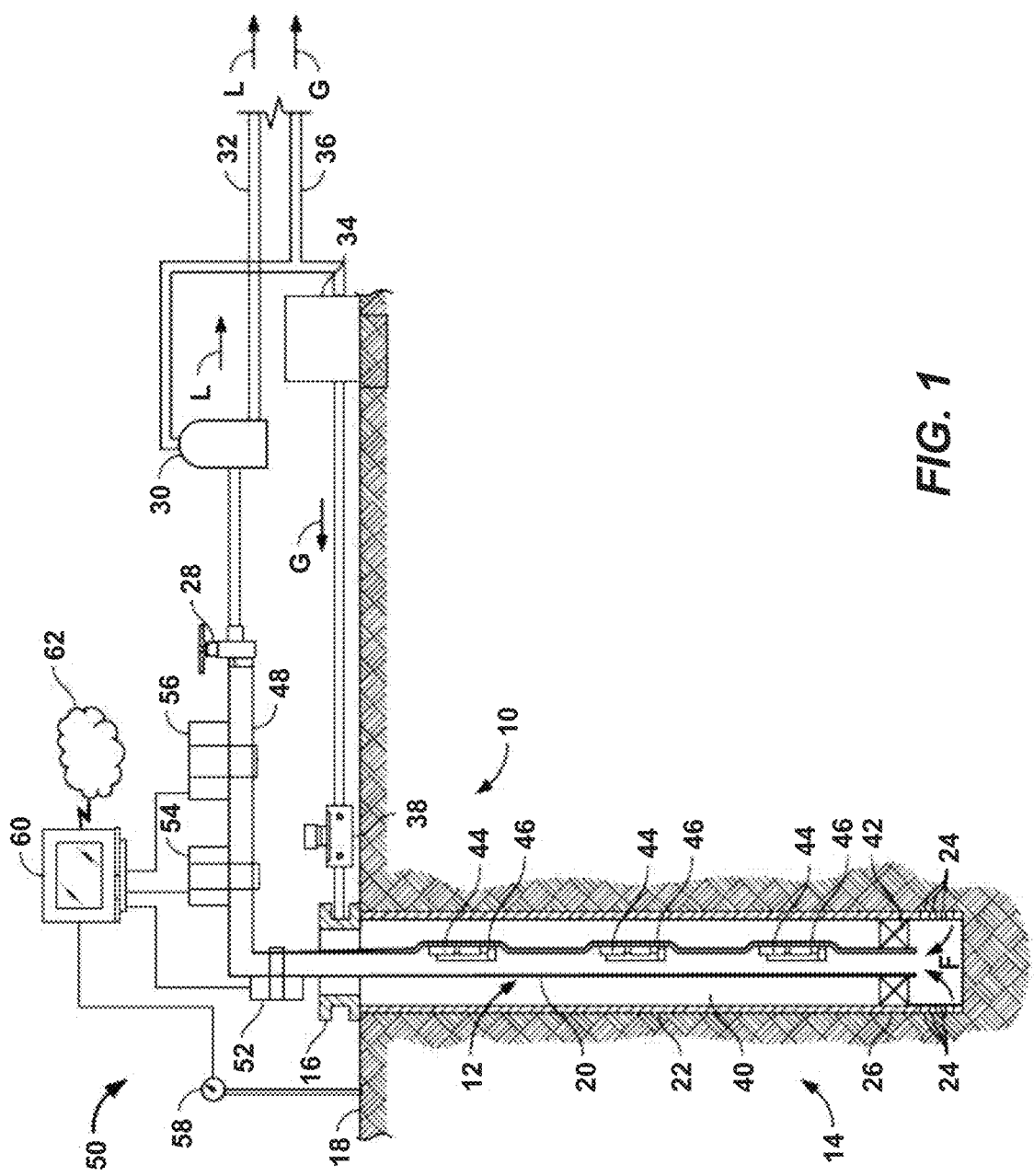
FIG. 1 is a side elevational view of an exemplary gas-lift well according to aspects of the disclosure.

The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than the broadest meaning understood by skilled artisans, such a special or clarifying definition will be expressly set forth in the specification in a definitional manner that provides the special or clarifying definition for the term or phrase.

For example, the following discussion contains a non-exhaustive list of definitions of several specific terms used in this disclosure (other terms may be defined or clarified in a definitional manner elsewhere herein). These definitions are intended to clarify the meanings of the terms used herein. It is believed that the terms are used in a manner consistent with their ordinary meaning, but the definitions are nonetheless specified here for clarity.

A/an: The articles "a" and "an" as used herein mean one or more when applied to any feature in embodiments and implementations of the present invention described in the specification and claims. The use of "a" and "an" does not limit the meaning to a single feature unless such a limit is specifically stated. The term "a" or "an" entity refers to one or more of that entity. As such, the terms "a" (or "an"), "one or more" and "at least one" can be used interchangeably herein.

About: As used herein, "about" refers to a degree of deviation based on experimental error typical for the particular property identified. The latitude provided the term "about" will depend on the specific context and particular property and can be readily discerned by those skilled in the art. The term "about" is not intended to either expand or limit the degree of equivalents which may otherwise be afforded a particular value. Further, unless otherwise stated, the term "about" shall expressly include "exactly," consistent with the discussion below regarding ranges and numerical data.

Above/below: In the following description of the representative embodiments of the invention, directional terms, such as "above", "below", "upper", "lower", etc., are used for convenience in referring to the accompanying drawings. In general, "above", "upper", "upward" and similar terms refer to a direction toward the earths surface along a wellbore, and "below", "lower", "downward" and similar terms refer to a direction away from the earth's surface along the wellbore. Continuing with the example of relative directions in a wellbore, "upper" and "lower" may also refer to relative positions along the longitudinal dimension of a wellbore rather than relative to the surface, such as in describing both vertical and horizontal wells.

And/or: The term "and/or" placed between a first entity and a second entity means one of (1) the first entity, (2) the second entity, and (3) the first entity and the second entity. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements). As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of".

Any: The adjective "any" means one, some, or all indiscriminately of whatever quantity.

At least: As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements). The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

Based on: "Based on" does not mean "based only on", unless expressly specified otherwise. In other words, the phrase "based on" describes both "based only on," "based at least on," and "based at least in part on."

Comprising: In the claims, as well as in the specification, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

Determining: "Determining" encompasses a wide variety of actions and therefore "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

Embodiments: Reference throughout the specification to "one embodiment," "an embodiment," "some embodiments," "one aspect," "an aspect," "some aspects," "some implementations," "one implementation," "an implementation," or similar construction means that a particular component, feature, structure, method, or characteristic described in connection with the embodiment, aspect, or implementation is included in at least one embodiment and/or implementation of the claimed subject matter. Thus, the appearance of the phrases "in one embodiment" or "in an embodiment" or "in some embodiments" (or "aspects" or "implementations") in various places throughout the specification are not necessarily all referring to the same embodiment and/or implementation. Furthermore, the particular features, structures, methods, or characteristics may be combined in any suitable manner in one or more embodiments or implementations.

Exemplary: "Exemplary" is used exclusively herein to mean "serving as an example, instance, or illustration." Any embodiment described herein as "exemplary" is not necessarily to be construed as preferred or advantageous over other embodiments.

Flow diagram: Exemplary methods may be better appreciated with reference to flow diagrams or flow charts. While for purposes of simplicity of explanation, the illustrated methods are shown and described as a series of blocks, it is to be appreciated that the methods are not limited by the order of the blocks, as in different embodiments some blocks may occur in different orders and/or concurrently with other blocks from that shown and described. Moreover, less than all the illustrated blocks may be required to implement an exemplary method. In some examples, blocks may be combined, may be separated into multiple components, may employ additional blocks, and so on. In some examples, blocks may be implemented in logic. In other examples, processing blocks may represent functions and/or actions performed by functionally equivalent circuits (e.g., an analog circuit, a digital signal processor circuit, an application specific integrated circuit (ASIC)), or other logic device. Blocks may represent executable instructions that cause a computer, processor, and/or logic device to respond, to perform an action(s), to change states, and/or to make decisions. While the figures illustrate various actions occurring in serial, it is to be appreciated that in some examples various actions could occur concurrently, substantially in series, and/or at substantially different points in time. In some examples, methods may be implemented as processor executable instructions. Thus, a machine-readable medium may store processor executable instructions that if executed by a machine (e.g., processor) cause the machine to perform a method.

May: The word "may" is used throughout this application in a permissive sense (i.e., having the potential to, being able to), not a mandatory sense (i.e., must).

Order of steps: It should also be understood that, unless clearly indicated to the contrary, in any methods claimed herein that include more than one step or act, the order of the steps or acts of the method is not necessarily limited to the order in which the steps or acts of the method are recited.

As used herein, the term "formation" refers to any definable subsurface region. The formation may contain one or more hydrocarbon-containing layers, one or more non-hydrocarbon containing layers, an overburden, and/or an underburden of any geologic formation.

As used herein, the term "hydrocarbon" refers to an organic compound that includes primarily, if not exclusively, the elements hydrogen and carbon. Examples of hydrocarbons include any form of natural gas, oil, coal, and bitumen that can be used as a fuel or upgraded into a fuel.

As used herein, the term "hydrocarbon fluids" refers to a hydrocarbon or mixtures of hydrocarbons that are gases or liquids. For example, hydrocarbon fluids may include a hydrocarbon or mixtures of hydrocarbons that are gases or liquids at formation conditions, at processing conditions, or at ambient conditions (20° C. and 1 atm pressure). Hydrocarbon fluids may include, for example, oil, natural gas, gas condensates, coal bed methane, shale oil, shale gas, and other hydrocarbons that are in a gaseous or liquid state.

As used herein, the term "sensor" includes any sensing device or gauge capable of monitoring or detecting pressure, temperature, fluid flow, vibration, resistivity, or other formation and/or fluid data. The sensor may an electrical sensor, an optical sensor, or any other suitable type of sensor. Alternatively, the sensor may be a position sensor.

As used herein, the term "subsurface" refers to geologic strata occurring below the earth's surface.

By "surface mounted sensor" is meant a sensor capable of being mounted to a gas lift well's surface equipment, such as the skin surface of a pipe, tubular or other well component, the sensor capable of conveying information concerning conditions relatable to an aspect of fluid flow, including temperature, pressure, fluid flow rate, vibration, acoustics or the like.

As used herein, the term "unconventional hydrocarbon asset" as used herein refers to any natural source of oil, gas, or other fuel product that is more difficult (for example, requires more energy input) to extract than conventional or "light" oil or gas. One skilled in the art will appreciate that a variety of unconventional hydrocarbon assets are known, although not all may be commercially exploited. Currently known unconventional oil sources include, but are not limited to, heavy oils, tar sands, and oil shale. Currently known unconventional gas sources include, but are not limited to, shale gas, coalbed methane, tight sandstones, and methane hydrates.

As used herein, the term "wellbore" refers to a hole in the subsurface made by drilling or insertion of a conduit into the subsurface. A wellbore may have a substantially circular cross section, or other cross-sectional shape. As used herein, the term "well," when referring to an opening in the formation, may be used interchangeably with the term "wellbore."

Description

Specific forms will now be described further by way of example. While the following examples demonstrate certain forms of the subject matter disclosed herein, they are not to be interpreted as limiting the scope thereof, but rather as contributing to a complete description.

Figure 2:
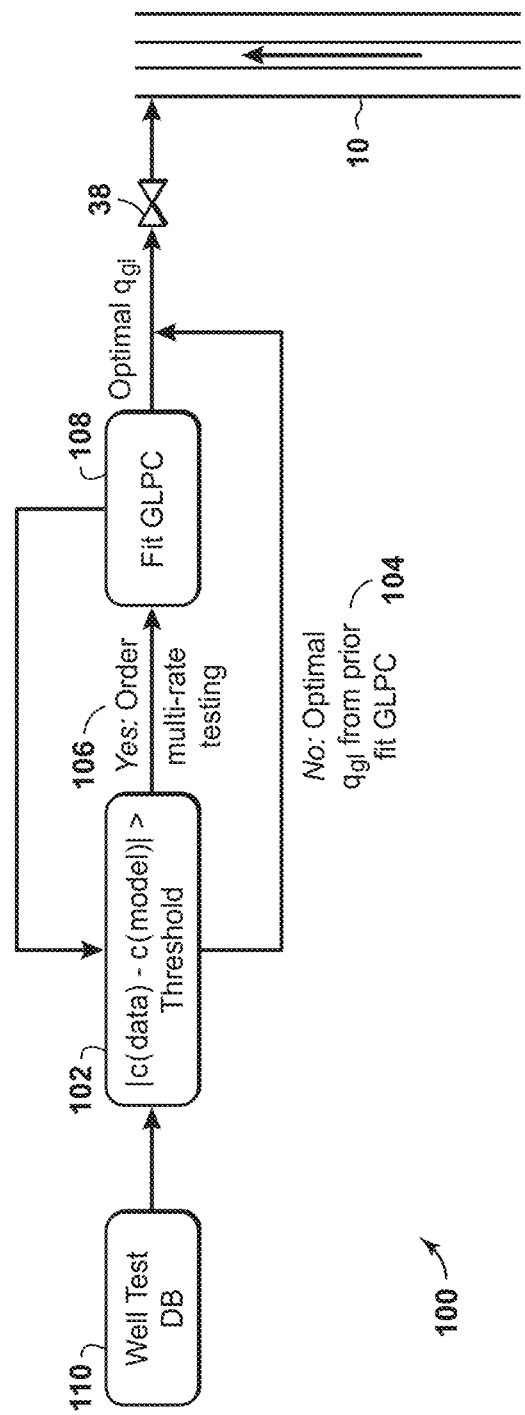
FIG. 2 is a schematic diagram of a control loop of the gas lift performance curves (GLPC) monitoring and multi-rate test request system according to disclosed aspects.

FIGS. 1-2 provide illustrative, non-exclusive examples of a method and system for optimizing the operation of a gas lift well, according to the present disclosure, together with elements that may include, be associated with, be operatively attached to, and/or use such a method or system for optimizing the operation of a gas lift well.

In FIGS. 1-2, like numerals denote like, or similar, structures and/or features; and each of the illustrated structures and/or features may not be discussed in detail herein with reference to the figures. Similarly, each structure and/or feature may not be explicitly labeled in the figures; and any structure and/or feature that is discussed herein with reference to the figures may be used with any other structure and/or feature without departing from the scope of the present disclosure.

In general, structures and/or features that are, or are likely to be, included in a given embodiment are indicated in solid lines in the figures, while optional structures and/or features are indicated in broken lines. However, a given embodiment is not required to include all structures and/or features that are illustrated in solid lines therein, and any suitable number of such structures and/or features may be omitted from a given embodiment without departing from the scope of the present disclosure.

Although the approach disclosed herein can be applied to a variety of artificially lifted well designs, the present description will primarily be related to the optimization of a well in which a gas lift system is used to artificially lift the well fluid.

Referring now to FIG. 1, an exemplary gas lift well 10 is illustrated. According to disclosed aspects, gas lift well 10 may be used to produce fluid from a wellbore 12 drilled or otherwise formed in a geological formation 14. A wellbore section of the gas lift system 10 is suspended below a wellhead 16 disposed, for example, at a surface 18 of the earth. A tubing 20 provides a flow path within wellbore 12 through which well fluid F is produced to wellhead 16.

As shown, wellbore 12 is lined with a wellbore casing 22 having perforations 24 through which fluid F flows from formation 14 into wellbore 12. For example, a hydrocarbon-based fluid F may flow from formation 14 through perforations 24 and into wellbore 12 adjacent an intake 26 of tubing 20. Upon entering wellbore 12, the well fluid F is produced upwardly by gas lift system 10 through tubing 20 to wellhead 16. From wellhead 16, the produced well fluid F is directed through control valve 28 to a separator 30 where gas G and liquid L are separated. The substantially liquid portion L of well fluid F may be directed to another location (not shown), such as, by way of example, through conduit 32.

Although gas lift system 10 may comprise a wide variety of components, the example in FIG. 1 is illustrated as having a gas compressor 34 that receives an injection gas from separator 30, and, optionally, from a gas source (not shown). Gas separated in separator 30 but not used as injection gas is directed to another location (not shown) through conduit 36. Gas compressor 34 forces the gas through a flow control valve 38, through wellhead 16 and into the annulus 40 between tubing 20 and casing 22. A packer 42 is designed to seal annulus 40 around tubing 20. In some embodiments, packer 42 is disposed proximate intake 26, as shown.

The pressurized gas G flows through the annulus 40 and is forced into the interior of tubing 20 through one or more gas lift valves 44, which may be disposed, for example, in corresponding side pocket mandrels 46. The gas flowing through gas lift valves 44 draws well fluid into intake 26 and upwardly through the interior of tubing 20. The mixture of injected gas G and well fluid F move upwardly through control valve 28 and are separated at separator 30 which directs the injection gas G back to gas compressor 34, and the liquid L, comprising a mixture of hydrocarbons and water, through conduit 32 for further processing.

As may be appreciated, well fluid F combined with injected gas lift gas G comprises a multiphase fluid, resulting in a major portion of gas and a minor portion of liquids at surface flowline conditions. In some embodiments, well fluid F may comprise greater than about 50% gas and less than about 50% liquids, or about 60% gas and about 40% liquids, or about 70% gas and about 30% liquids, or about 80% gas and about 20% liquids, or about 90% gas and about 10% liquids, or about 95% gas and about 5% liquids or greater than about 95% gas and less than about 5% liquids. There may be production periods where well fluid F may comprise substantially all gas, with intermittent or varying liquid production periods. The term multiphase fluid merely refers to a fluid that in some embodiments or occasions may have multiple phases present, while during other embodiments or occasions may comprise substantially 100% gas. The phase category of gas or liquid is determined at or near the well surface or wellhead.

Aspects disclosed herein require well performance data to be obtained from one or more gas lift wells. An exemplary method of obtaining such well performance data, using well temperature data, may be found in commonly owned U.S. Pat. No. 10,012,059, the disclosure of which is incorporated by reference herein. Other methods of obtaining well performance data may be used as desired. Still referring to FIG. 1, a system 50 for optimizing the operation of a gas lift well 10 is depicted. System 50 includes one or more surface mounted sensors. The one or more surface mounted sensors include at least one temperature sensor 52, which may be a temperature transducer, thermocouple, thermistor, resistance temperature detector (RTD), or the like. In some aspects, the at least one surface mounted sensor includes a plurality of surface mounted sensors, such as an acoustic sensor 54 and a sensor 56. Each of the plurality of surface mounted sensors may be mounted to the gas lift well's surface equipment, such as, by way of example and not of limitation, a production conduit 48. System 50 may also include an ambient temperature sensor 58 positioned so as to monitor ambient temperature conditions at or near the well 10.

To process data obtained from the plurality of surface mounted sensors 52, 54 and/or 56, and the ambient temperature sensor 58, a computer 60 comprising storage means (not shown) and a processor for processing (not shown) may be employed. Computer 60 may be operatively connected to the internet to transmit data for monitoring and/or storage to a remote or cloud server 62. As may be appreciated by those skilled in the art, computer 60 may be present at the well site, as shown, or the data transmitted to a remote location via satellite, wireless, telephonic or other means of transmission. Computer 60 is programmed to determine gas lift performance from the data obtained from the plurality of surface mounted sensors 52, 54 and/or 56, and the ambient temperature sensor 58. In some aspects, computer 60 may be programmed to adjust the data obtained from the temperature sensor 52 for ambient temperature measurements obtained from the ambient temperature sensor 58.

As may be appreciated by those skilled in the art, a production well producing from a reservoir has a bottomhole temperature (BHT). Produced fluids carry and lose reservoir heat as they flow to surface. The more quickly fluids flow from the reservoir to the surface, the less heat they can lose, and the higher temperature they should have when produced. Hypothetically, if a well were able to move fluids from the reservoir to the surface instantaneously, the measured liquid temperature at the surface would be identical to the BHT. Likewise, if the same well is not flowing for a given time, the measured surface temperature would approach that of the ambient temperature. Using these boundaries, along with the knowledge that gases tend to match the temperature of the liquids they are produced with, external wellhead/flowline and ambient temperatures can be used to qualitatively determine the liquid flow rate of a gas-lifted well.

According to disclosed aspects, a method is provided for determining the frequency of a multi-rate well testing operation. This approach allows for multi-rate tests to be performed only when they are needed, thus saving on the cost and resources, an important consideration particularly in the setup of large numbers of wells. FIG. 2 schematically depicts a control loop of the gas lift performance curves (GLPC) monitoring and multi-rate test request system 100. The system proactively monitors the performance of the well derived from regularly scheduled single-rate well tests, with its previously derived performance. Such testing may be based on temperature-based measurements as shown in FIG. 1 or through other known performance testing strategies, and may generate GLPC or other information relating or derived from observed or calculated flow rate. At box 102, the system 100 queries whether the difference between a well performance characteristic (such as a GLPC) exceeds a corresponding model-based GLPC by a predetermined threshold or limit. As used herein, "model-based" refers to either an external model or a fit of the GLPC from a previous multi-rate test. Such a predetermined threshold or limit may be considered a performance indicator of the system and can be adapted over time in a dynamic fashion, according to the analysis results of recent multi-rate data. If at 104 the answer is no, it is determined that the flow rate is within an optimal well performance characteristic based from the prior fit GLPC, and a flow control valve 38 is operated to inject an optimal amount of gas into the corresponding gas-lifted well 10. However, if at 106 the answer is yes, the need for a multi-rate test is signaled. At box 108 the multi-rate testing is fit to a GLPC, and an optimal flow rate is derived therefrom. The control valve 38 is operated to inject an optimal amount of gas into the gas-lifted well 10.

According to disclosed aspects, the well performance characteristic may be a temperature, a flow rate, or a pressure, such as a bottom-hole pressure (BHP), or the like, or a combination of any of these characteristics. For example, when using BHP as the well performance characteristic, minimizing the BHP results in maximizing the liquid rate. In this case 102 will be replaced by a threshold on the delta (or the relative difference) of the measured BHP from the one expected from the model. Continuous monitoring of the BHP is typically available in wells with downhole gauges and does not require dedicated test separators. When using temperature as the well performance characteristic, the temperature of a well fluid may be used. The well fluid may be a fluid in the well. Alternatively, the temperature of a well fluid in a flowline outside the well may also be used, it being understood that the flowline temperature correlates well to a fluid temperature in the well.

In the presence of any limited well modeling capability and some corresponding production history, an initial multi-rate testing frequency and schedule can be derived to initialize the system. Adaptations to this pre-determined schedule can be made using a continuous monitoring approach as described above.

The system according to disclosed aspects may be implemented in real-time and automatically, where the well test data is continuously accessed and analyzed to 1) make a determination of new multi-rate testing requirements, 2) derive gas lift performance curves from collected multi-rate tests, and 3) optimize production by calculating the optimal allocation of gas lift among wells. Though the actions can be implemented in a closed-loop fashion, a production or operations engineer can potentially monitor system results and make the final call on any or all of the actionable items.

The disclosed aspects may benefit from any limited well modeling availability, and also may be implemented based on exclusively data-driven approaches. In the context of the current disclosure, data-driven approaches refer to techniques that may derive the response of the well to gas lifting, also referred to as gas lift performance curves, from multi-rate well testing processes. In this type of testing, the production of a well is examined and recorded under various gas lift injection rates.

If no model is available, initial values for the frequency of multi-rate tests and for the number of stages can be determined from an analysis of historical data, which may be accessed from a well test database 110. The injection rates may then be adjusted as follows: (a) the frequency of the multi-rate tests is reduced if the shape of the GLPC does not change significantly between the tests, and the frequency of the tests is increased if the change is larger than expected; and (b) the number of stages may be selected based on the accuracy of the multi-rate test liquid rate and gas lift rate measurements, and on the shape of the curve.

A significant change in GLPC is one that is beyond a threshold (e.g. a 3 sigma band of the GLPC shape) from the previous multi-rate test when the previous shape is shifted to pass through the points of the current multi-rate test (refit where only the vertical shift parameter is allowed to vary). Only the portions of the curves from a no gas lift value up to the maximum production point are compared. A new refit is still performed and the GLPC updated. However, a non-significant variation of the GLPC may inform a decision on increasing the threshold for a new multi-rate test.

The availability of a model enables the system to simulate multi-rate tests, evaluate different strategies for multi-rate test scheduling, and evaluate the number of multi-rate stages across the production history of a well. Any forward model capable of predicting the production of a well as a function of time and gas lift rate may be used. An example model may be updated at every well test for a specific well. Of course, if such model was available for every well in a field it could be directly used for a gas lift optimization workflow. However, the kind of predictive models necessary typically require a large amount of time and effort to initially build and tune, and they need to be maintained (re-tuned) throughout the life of the well.

An alternative approach is to use a reduced number of models distributed across wells to provide good coverage for all types of well completions and structures, and the reservoir(s) from which the wells are producing. A data-driven approach can then be adopted to fill in the gaps and provide simpler and more maintainable (but not necessarily less effective) strategy to cover all the wells in a field. The data-driven models are compared to the more detailed models where those are available, to ensure the data-driven models perform as expected.

The simulated data may also be used to determine the optimal number of multi-rate stages. This may be defined as the lowest number of stages for which the loss of production is within an acceptable threshold from the optimal (where the optimal production is given by the model). In some aspects, the model does not need to be very accurate. It only needs to provide a reasonable description of the evolution of the well GLPC with time. Further corrections to the rate and number of stages, determined via the model-based study, are possible independent of the model by monitoring the outcome of multi-rate tests. In an example well, a three stage multi-rate test yields a performance within 1% of the model prediction, while the four-stage and five-stage tests provide only marginal improvements.

The disclosed aspects may be implemented to optimize hydrocarbon production in a collection of wells, which may include injection and production wells. A well performance characteristic of a plurality of wells in the collection of wells may be monitored using single-rate well tests. The monitored well performance characteristic is compared to a respective current well model performance characteristic. If one of the monitored well performance characteristics differs from the respective current well model performance characteristic by less than a predetermined amount, an amount of gas is injected into one or more of the wells based on the current well model performance characteristic. If the monitored well performance characteristic differs from the current well model performance characteristic by more than a predetermined amount, a multi-rate well test may be initiated for one or more of the wells and the results of the multi-rate well test are fitted to a revised well model performance characteristic. An amount of gas may be injected into one or more of the collection of wells based on the revised well model performance characteristic. In this manner hydrocarbon production of the collection of wells may be optimized.

Figure 3:
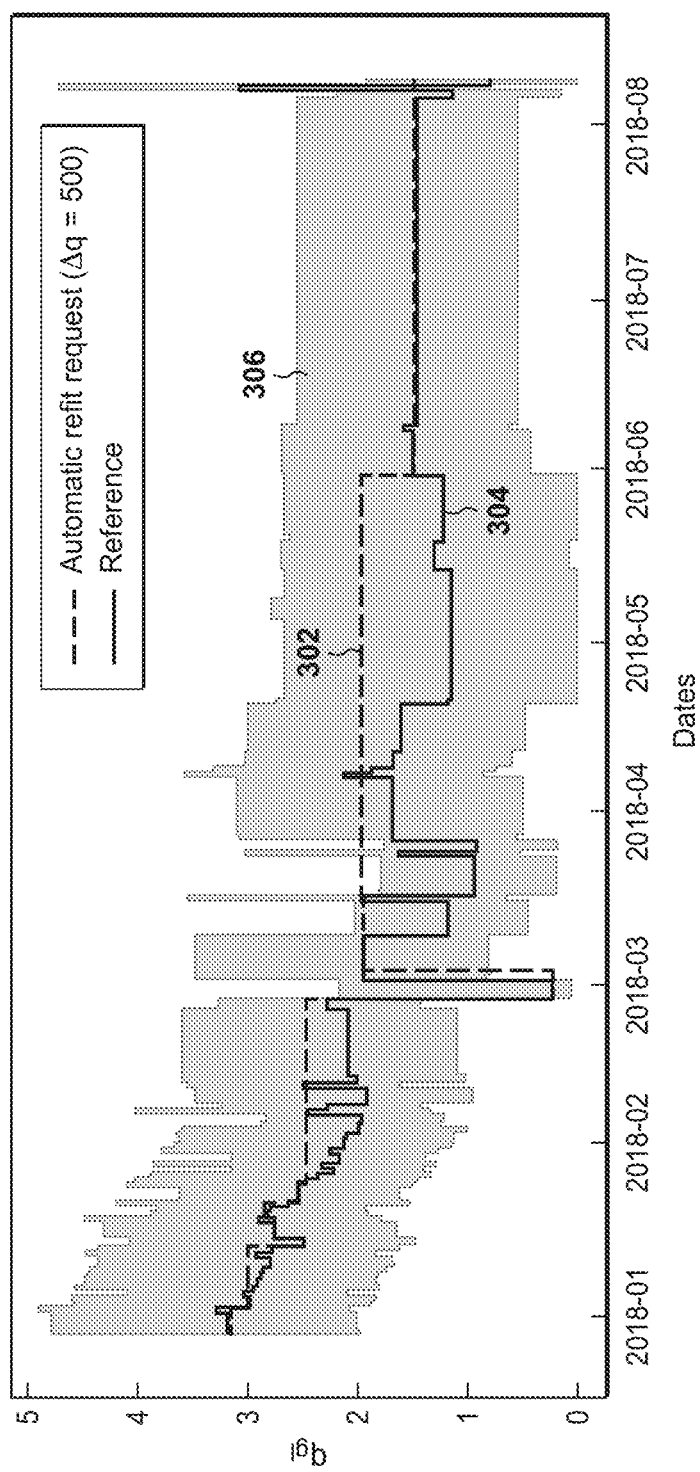
FIG. 3 is a graph showing optimal gas lift rates as a function of time according to disclosed aspects.

FIG. 3 is a graph showing, as a function of time, the optimal gas lift rate 302 with a rate threshold of 500 standard barrels per day (stdb/day) as compared to the prediction from the model 304. The gray band 306 indicates how much deviation from the 304 curve is possible and still be within 1% of the optimal production. In an aspect, the gas lift rate determined from the on-demand update of the GLPC in 302 is almost always within the gray band.

Figure 4:
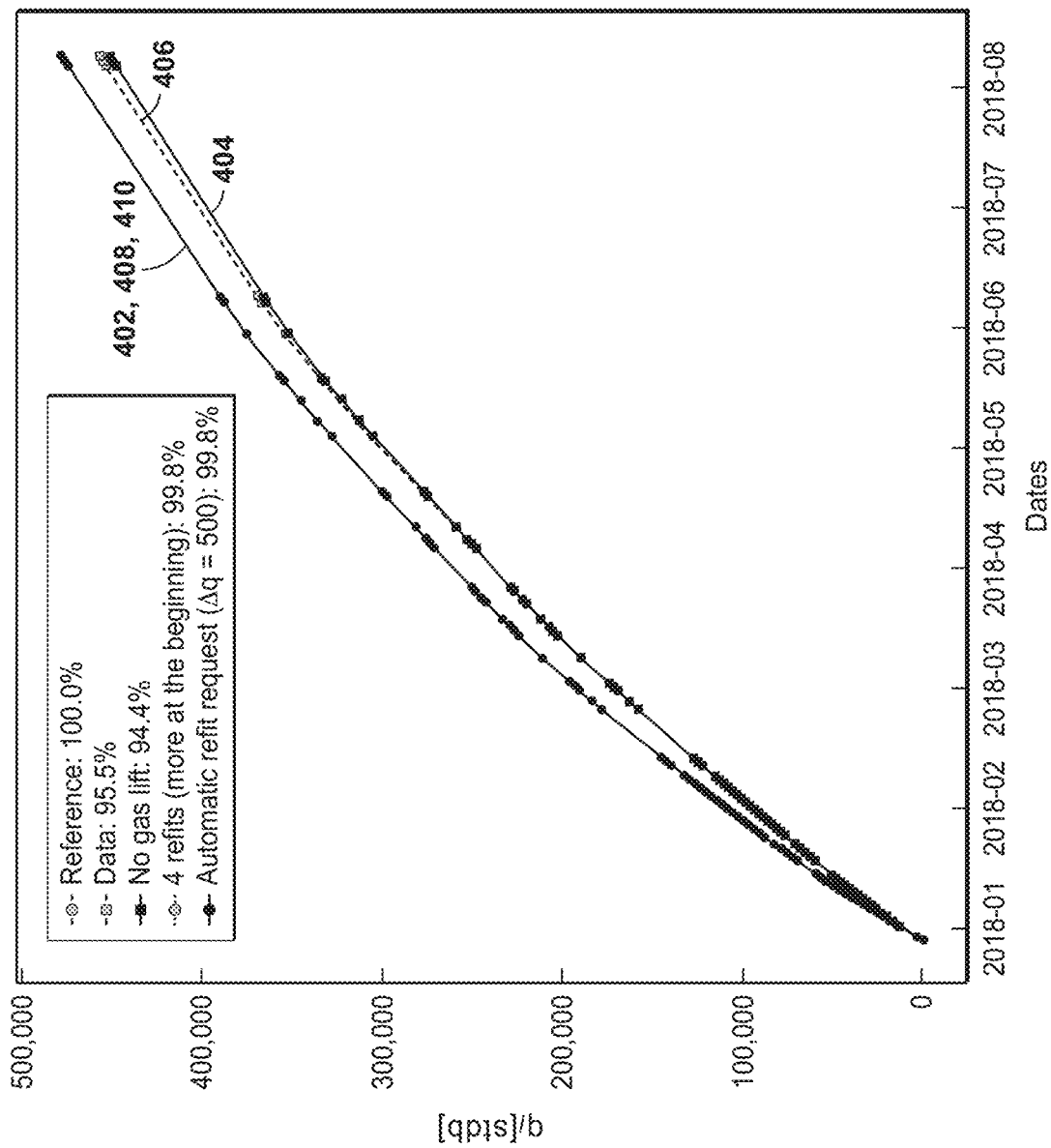
FIG. 4 is a graph showing cumulative liquids production of a gas-lift well according to disclosed aspects and FIG. 5 is a flowchart of a method of determining movement of a fluid into or out of a subsurface wellbore according to disclosed aspects.

FIG. 4 is a graph showing a comparison of the cumulative liquids production as a function of time for the gas lift rate corresponding to the rate threshold of 500 stb/day 402, the case of no gas lift rate 404, the data 406, a case of four pre-scheduled multi-rate tests 408, and the model prediction 410. The data-driven approach with a threshold based on a 500 stb/day rate change yields a total production within 0.2% of the model prediction. Similar performances are obtained with five-stage, four-stage and three-stage multi-rate tests, pointing to the three stage test as the most economical way of achieving near-optimal production.

Figure 5:
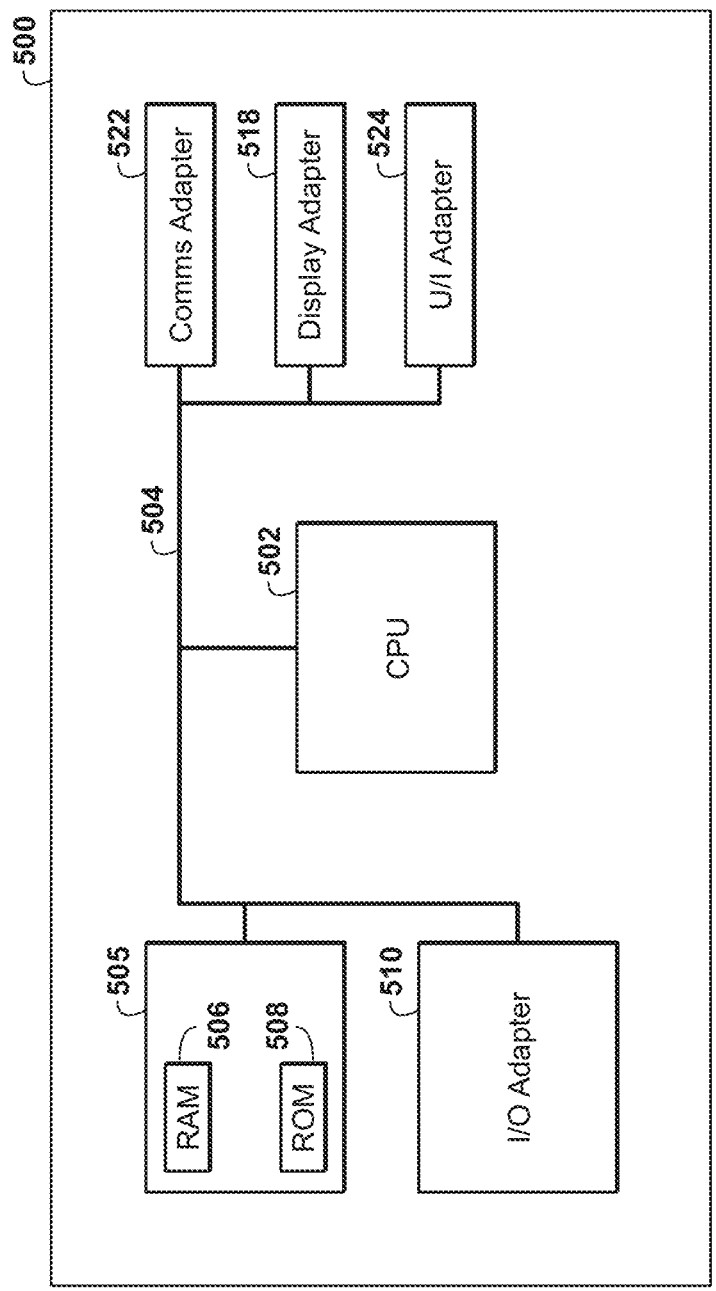

One or more steps of the disclosed aspects may be accomplished using a computing device. For example, a computing device is particularly suited for automating repeat time of flight and flow rate calculations for a plurality of points along the wellbore. One of ordinary skill in the art will readily understand how to employ a computing device to accomplish various aspects of the disclosure. FIG. 5 is a block diagram of a general purpose computer system 500 suitable for implementing one or more aspects of the components described herein. In some disclosed aspects, the computer system 500 may comprise the architecture of computer 60 shown in FIG. 1. The computer system 500 includes a central processing unit (CPU) 502 coupled to a system bus 504. The CPU 502 may be any general-purpose CPU or other types of architectures of CPU 502 (or other components of exemplary system 500), as long as CPU 502 (and other components of system 500) supports the operations as described herein. Those of ordinary skill in the art will appreciate that, while only a single CPU 502 is shown in FIG. 5, additional CPUs may be present. Moreover, the computer system 500 may comprise a networked, multi-processor computer system that may include a hybrid parallel CPU/Graphics Processing Unit (GPU) system (not depicted). The CPU 502 may execute the various logical instructions according to various embodiments. For example, the CPU 502 may execute machine-level instructions for performing processing according to the operational flow described above in conjunction with FIGS. 1-4.

The computer system 500 may also include computer components such as non-transitory, computer-readable media or memory 505. The memory 505 may include a RAM 506, which may be SRAM, DRAM, SDRAM, or the like. The memory 505 may also include additional non-transitory, computer-readable media such as a Read-Only-Memory (ROM) 508, which may be PROM, EPROM, EEPROM, or the like. RAM 506 and ROM 508 may hold user data, system data, data store(s), process(es), and/or software, as known in the art. The memory 505 may suitably store predefined configuration data and/or placement information, e.g., predefined configuration data and/or placement information as described in connection with FIGS. 1-4. The computer system 500 may also include an input/output (I/O) adapter 510, a communications adapter 522, a user interface adapter 524, and a display adapter 518.

The I/O adapter 510 may connect one or more additional non-transitory, computer-readable media such as an internal or external storage device(s) (not depicted), including, for example, a hard drive, a compact disc (CD) drive, a digital video disk (DVD) drive, a floppy disk drive, a tape drive, and the like to computer system 500. The storage device(s) may be used when the memory 505 is insufficient or otherwise unsuitable for the memory requirements associated with storing data for operations of embodiments of the present techniques. The data storage of the computer system 500 may be used for storing information and/or other data used or generated as disclosed herein. For example, storage device(s) may be used to store configuration information or additional plug-ins in accordance with an embodiment of the present techniques. Further, user interface adapter 524 may couple to one or more user input devices (not depicted), such as a keyboard, a pointing device and/or output devices, etc. to the computer system 500. The CPU 502 may drive the display adapter 518 to control the display on a display device (not depicted), e.g., a computer monitor or handheld display, to, for example, present information to the user regarding location.

The computer system 500 further includes communications adapter 522. The communications adapter 522 may comprise one or more separate components suitably configured for computer communications, e.g., one or more transmitters, receivers, transceivers, or other devices for sending and/or receiving signals. The computer communications adapter 522 may be configured with suitable hardware and/or logic to send data, receive data, or otherwise communicate over a wired interface or a wireless interface, e.g., carry out conventional wired and/or wireless computer communication, radio communications, near field communications (NFC), optical communications, scan an RFID device, or otherwise transmit and/or receive data using any currently existing or later-developed technology. In some embodiments, the communications adapter 522 is configured to receive and interpret one or more signals indicating location, e.g., a GPS signal, a cellular telephone signal, a wireless fidelity (Wi-Fi) signal, etc.

The architecture of system 500 may be varied as desired. For example, any suitable processor-based device may be used, including without limitation personal computers, laptop computers, computer workstations, and multi-processor servers. Moreover, embodiments may be implemented on application specific integrated circuits (ASICs) or very large scale integrated (VLSI) circuits. Additional alternative computer architectures may be suitably employed, e.g., using one or more operably connected external components to supplement and/or replace an integrated component. In fact, persons of ordinary skill in the art may use any number of suitable structures capable of executing logical operations according to the embodiments. In an embodiment, input data to the computer system 500 may include various plug-ins and library files. Input data may additionally include configuration information.

INDUSTRIAL APPLICABILITY

The apparatus and methods disclosed herein are applicable to the oil and gas industry.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

What is claimed is:

1. A method for determining a frequency of a multi-rate well testing operation in a gas-lifted hydrocarbon well, comprising:
    monitoring a well performance characteristic of the well using single-rate well tests;
    comparing the monitored well performance characteristic to a current well model performance characteristic;
    if the monitored well performance characteristic differs from the current well model performance characteristic by less than a predetermined amount, injecting an amount of gas into the well based on the current well model performance characteristic;
    if the monitored well performance characteristic differs from the current well model performance characteristic by more than the predetermined amount,
    initiating a multi-rate well test,
    fitting results of the multi-rate well test to a revised well model performance characteristic, and
    injecting the amount of gas into the well based on the revised well model performance characteristic.

2. The method of claim 1, wherein the current well model performance characteristic is a gas lift performance curve (GLPC) model derived from a prior fit to the multi-rate well test, and wherein the revised well model performance characteristic is a revised GLPC fit.

3. The method of claim 2, wherein comparing the monitored well performance characteristic to the current well model performance characteristic comprises:
    comparing the monitored well model performance characteristic to the current well model performance characteristic only from a no gas lift value up to a maximum production point.

4. The method of claim 2, wherein a recent history of GLPC shape of fit is used to modify the predetermined amount and a frequency of initiating the multi-rate well test, based on whether a need for the multi-rate well test is signaled.

5. The method of claim 1, wherein the well is one of a collection of wells, and further comprising:
    monitoring the well performance characteristic of each of a plurality of wells in the collection of wells using single-rate well tests;
    comparing the monitored well performance characteristic of each of the plurality of wells to a respective current well model performance characteristic;
    if the monitored well performance characteristic of one of the plurality of wells differs from the respective current well model performance characteristic by less than the predetermined amount, injecting the amount of gas into the one of the plurality of wells based on the respective current well model performance characteristic;
    if the monitored well performance characteristic of the one of the plurality of wells differs from the respective current well model performance characteristic by more than the predetermined amount,
    initiating the multi-rate well test for the one of the plurality of wells,
    fitting the results of the multi-rate well test to the revised well model performance characteristic, and
    injecting the amount of gas into the one of the plurality of wells based on the revised well model performance characteristic,
    wherein hydrocarbon production of the collection of wells is optimized.

6. The method of claim 1, wherein the current well model performance characteristic is a current representation of production in the well, and wherein the revised well model performance characteristic is a revised production representation in the well.

7. The method of claim 1, wherein a control valve is associated with the well, and wherein the amount of gas is injected into the well by controlling the control valve.

8. The method of claim 1, further comprising:
generating the current well model performance characteristic by analyzing historical well performance data.

9. The method of claim 1, further comprising:
selecting a number of stages of the multi-rate well test based at least in part on one of:
accuracy of multi-rate well test, and
a shape of a current GLPC fit.

10. The method of claim 1, wherein the monitored well performance characteristic comprises one of
fluid flow in a portion of the well,
temperature of a well fluid, and
a pressure of the well fluid.

11. The method of claim 10, wherein the well fluid is in the well or in a flowline associated with the well.

12. A computer system, comprising:
a memory; and
a processor in communication with the memory, the processor programmed to determine a frequency of a multi-rate well testing operation in a gas-lifted hydrocarbon well by
monitoring a well performance characteristic of the well using single-rate well tests,
comparing the monitored well performance characteristic to a current well model performance characteristic,
if the monitored well performance characteristic differs from the current well model performance characteristic by less than a predetermined amount, generating a first instruction to inject an amount of gas into the well based on the current well model performance characteristic; and
if the monitored well performance characteristic differs from the current well model performance characteristic by more than the predetermined amount, generating a second instruction to initiate a multi-rate well test, and fitting results of the multi-rate well test to a revised well model performance characteristic.

13. The computer system of claim 12, wherein the processor is further programmed to generate the first instruction to inject the amount of gas into the well based on the revised well model performance characteristic.

14. The computer system of claim 12, wherein the current well model performance characteristic is a gas lift performance curve (GLPC) model derived from a prior fit to the multi-rate well test, and wherein the revised well model performance characteristic is a revised GLPC fit.

15. The computer system of claim 14, wherein comparing the monitored well performance characteristic to the current well model performance characteristic comprises:
comparing the monitored well model performance characteristic to the current well model performance characteristic only from a no gas lift value up to a maximum production point.

16. The computer system method of claim 14, wherein a recent history of GLPC shape of fit is used to modify the predetermined amount and a frequency of initiating the multi-rate well test, based on whether a need for the multi-rate well test is signaled.

17. The computer system of claim 12, wherein a control valve is associated with the well, and wherein the amount of gas is injected into the well by controlling the control valve.

18. The computer system of claim 12, wherein the processor is further configured to generate the current well model performance characteristic by analyzing historical well performance data.

19. The computer system of claim 12, wherein the processor is further configured to select a number of stages of the multi-rate well test based at least in part on accuracy of the multi-rate well test.

20. The computer system of claim 12, wherein the processor is further configured to select a number of stages of the multi-rate well test based at least in part on a shape of a current GLPC fit.

* * * * *